United States Patent
Kuo et al.

(10) Patent No.: US 7,605,629 B2
(45) Date of Patent: Oct. 20, 2009

(54) ADJUSTING CIRCUIT AND METHOD FOR DELAY CIRCUIT

(75) Inventors: Tung-Chen Kuo, Hsin-Chu (TW); Kuen-Bin Lai, Hsin-Chu (TW)

(73) Assignee: Realtek Semiconductor Corp., HsinChu (TW)

( * ) Notice: Subject to any disclaimer, the term of this patent is extended or adjusted under 35 U.S.C. 154(b) by 22 days.

(21) Appl. No.: 11/749,757

(22) Filed: May 17, 2007

(65) Prior Publication Data

US 2007/0273422 A1    Nov. 29, 2007

(30) Foreign Application Priority Data

May 17, 2006    (TW) ............................... 95117438 A

(51) Int. Cl.
    *H03H 11/26* (2006.01)
(52) U.S. Cl. ...................................... 327/261; 327/161
(58) Field of Classification Search ........................ None
    See application file for complete search history.

(56) References Cited

U.S. PATENT DOCUMENTS

| 6,404,833 | B1* | 6/2002 | Takebe | 375/371 |
| 6,518,807 | B1* | 2/2003 | Cho | 327/158 |
| 6,940,768 | B2 | 9/2005 | Dahlberg | |
| 6,950,487 | B2 | 9/2005 | Lin | |
| 2001/0050581 | A1* | 12/2001 | Saeki | 327/158 |
| 2005/0127964 | A1* | 6/2005 | Lee | 327/158 |

* cited by examiner

*Primary Examiner*—Cassandra Cox
(74) *Attorney, Agent, or Firm*—Winston Hsu

(57) ABSTRACT

Disclosed is an adjusting circuit for determining a target delay clock signal of a delay circuit having a plurality of delay units. The delay circuit generates a plurality of delay clock signals, and the adjusting circuit includes: a difference signal generating circuit, for generating a plurality of difference signals according to a reference clock signal and the delay clock signals; a delay processing circuit, coupled to the difference signal generating circuit, for determining the target delay clock signal by computing a corresponding number of delay units for a specific phase of the reference clock signal according to the difference signals; wherein the target delay clock signal is one of the delay clock signals.

34 Claims, 11 Drawing Sheets

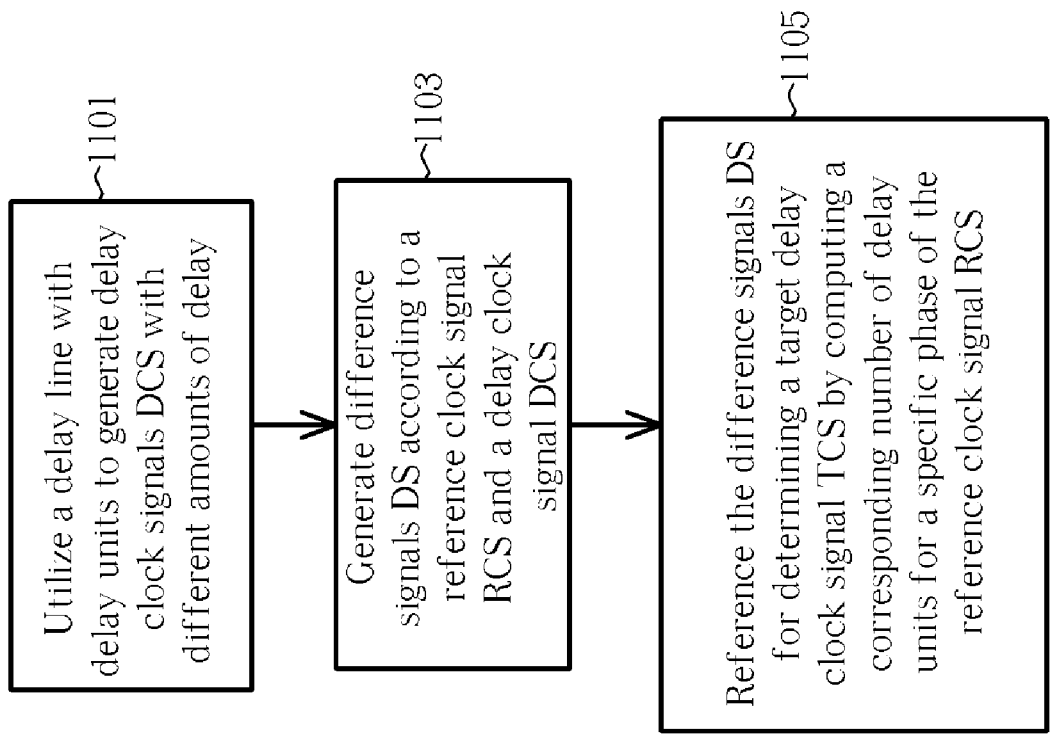

ADJUSTING CIRCUIT AND METHOD FOR DELAY CIRCUIT

BACKGROUND OF THE INVENTION

1. Field of the Invention

The present invention relates to an adjusting circuit, and particularly relates to an adjusting circuit for a delay circuit.

2. Description of the Prior Art

Delay circuits are usually utilized for synchronizing a plurality of clocks. Normally, delay circuits can be classified into analog delay circuits and digital delay circuits.

FIG. 1 is a schematic diagram illustrating a prior art analog delay circuit 100, which utilizes an input clock to generate a plurality of delay clocks with the same frequency but different phases. As shown in FIG. 1, the delay circuit 100 comprises: a phase detector 102, a charge pump 104, a loop filter 106, and a delay line 108. The input clock $CK_{IN}$ (with a period T) is an input signal of the delay circuit 100. The control voltage $V_{ctrl}$ from the loop filter 106 adjusts the delay effect of the input clock $CK_{IN}$ by using the delay stages of the delay line 108. In this case for example, the delay line 108 includes N delay stages in series (not illustrated), and the delay clock from the m-th delay stage is $CK_m$. The delay clock $CK_N$ of the last delay stage falls behind the input clock $CK_{IN}$ by a delay period of Td. The phase detector compares the phase difference between the input clock $CK_{IN}$ and the delay clock $CK_N$ to generate a rising control signal UP and a falling control signal DOWN, in order to control the charge pump 104, which outputs the control voltage $V_{ctrl}$ via the loop filter 106, thereby increasing or decreasing Td.

A variety of digital delay circuits are well known to those of ordinary skills in the art; therefore, details are thus omitted here for brevity. A conventional digital delay circuit includes a delay line having a plurality of delay stages (for example, an inverter) and utilizes a multiplexer (MUX), an inverter or other types of digital devices to control the delay stage.

Both analog and digital delay circuits have their disadvantages. The delay circuit 100 shown in FIG. 1 includes several components, and therefore occupies massive circuit area. An analog circuit provides low accuracy and needs extra circuits for control. However, delay stages of a digital delay circuit are easily affected by process, voltage, and temperature (PVT), causing errors between the signals obtained and expected. Furthermore, a digital delay circuit will require a longer delay line if reaching different operation frequencies is desired. For example, if the operation frequency is required to be X-times higher, then a delay line that is longer by a multiple of X-times is required.

Thus, a new invention is needed to solve the above-mentioned problems.

SUMMARY OF THE INVENTION

One objective of the present invention is to provide an adjusting circuit for a delay circuit, for adjusting the delay amount and the outputting of the delay signal while the delay amount of the delay line changes.

One embodiment of the present invention discloses an adjusting circuit for determining a target delay clock signal of a delay circuit having a plurality of delay units. The delay circuit generates a plurality of delay clock signals, and the adjusting circuit comprises: a difference signal generating circuit, for generating a plurality of difference signals according to a reference clock signal and the delay clock signals; a delay processing circuit, coupled to the difference signal generating circuit, for determining the target delay clock signal by computing a corresponding number of delay units for a specific phase of the reference clock signal according to the difference signals; wherein the target delay clock signal is one of the delay clock signals.

Another embodiment discloses a method for adjusting a delay clock signal, which corresponds to the adjusting circuit. The method comprises: (a) generating a plurality of difference signals according to a reference clock signal and the delay clock signals; and (b) determining a target delay clock signal by computing a corresponding number of delay units for a specific phase of the reference clock signal according to the difference signals, wherein the target delay clock signal is one of the delay clock signals.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 11 is a flow chart of a method for adjusting a delay clock signal corresponding to a delay circuit of the adjusting circuit of the present invention.

DETAILED DESCRIPTION

Figure 1:
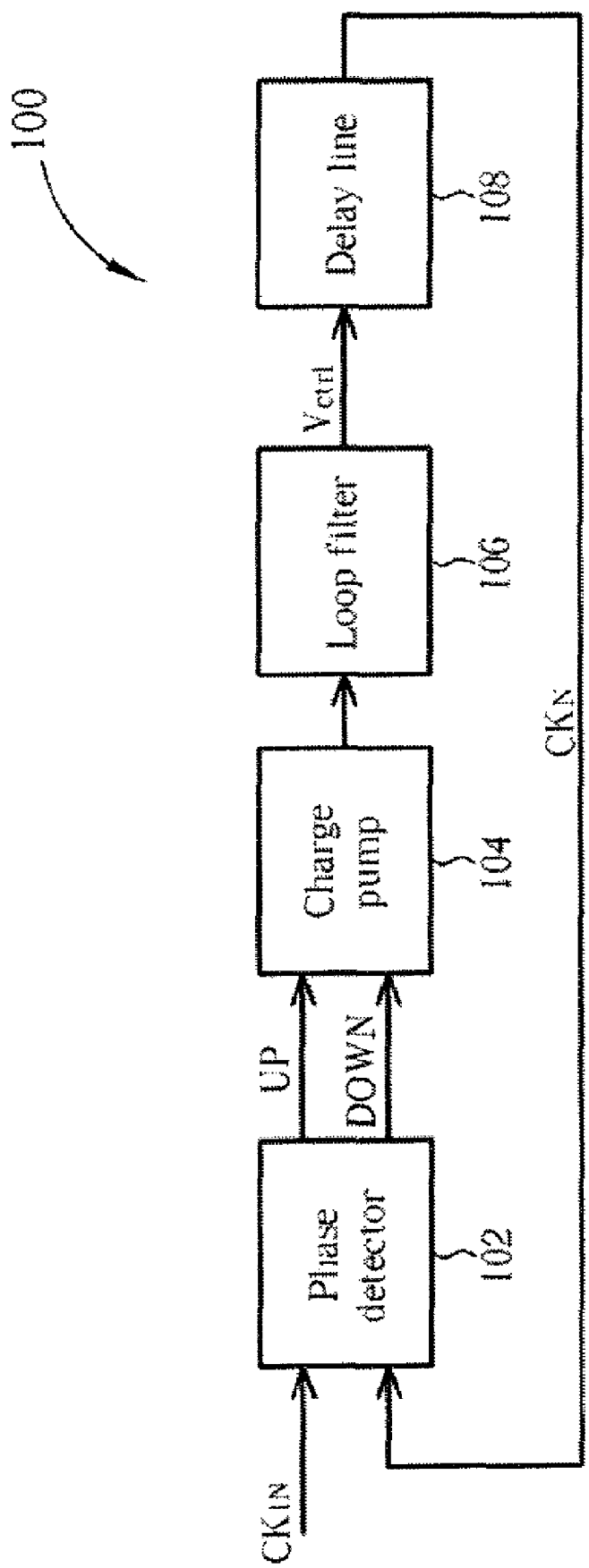
FIG. 1 is a schematic diagram illustrating a prior art analog delay circuit.
Figure 2:
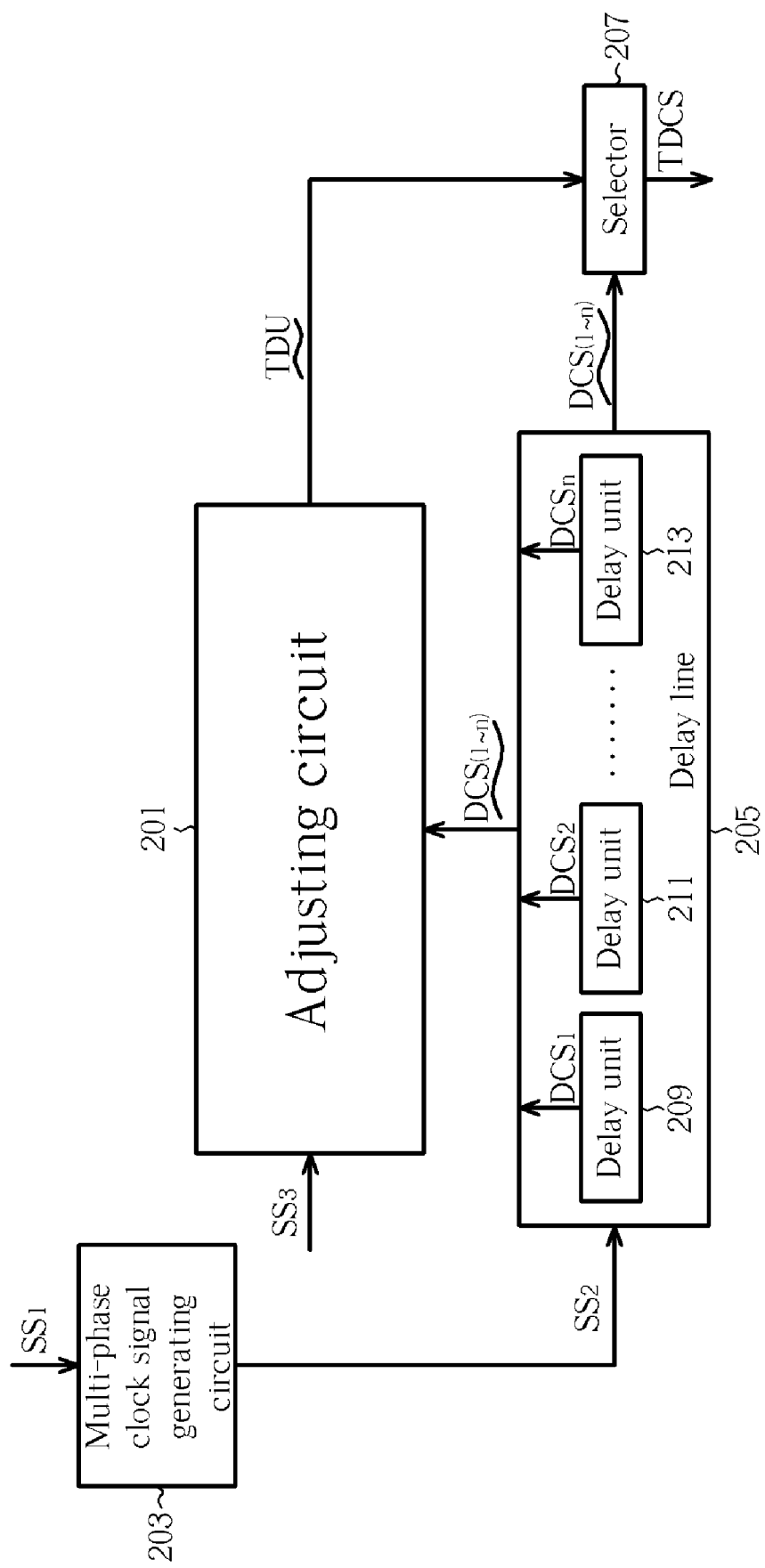
FIG. 2 is a block diagram illustrating a delay circuit utilizing an adjusting circuit according to a preferred embodiment of the present invention.
Figure 3:
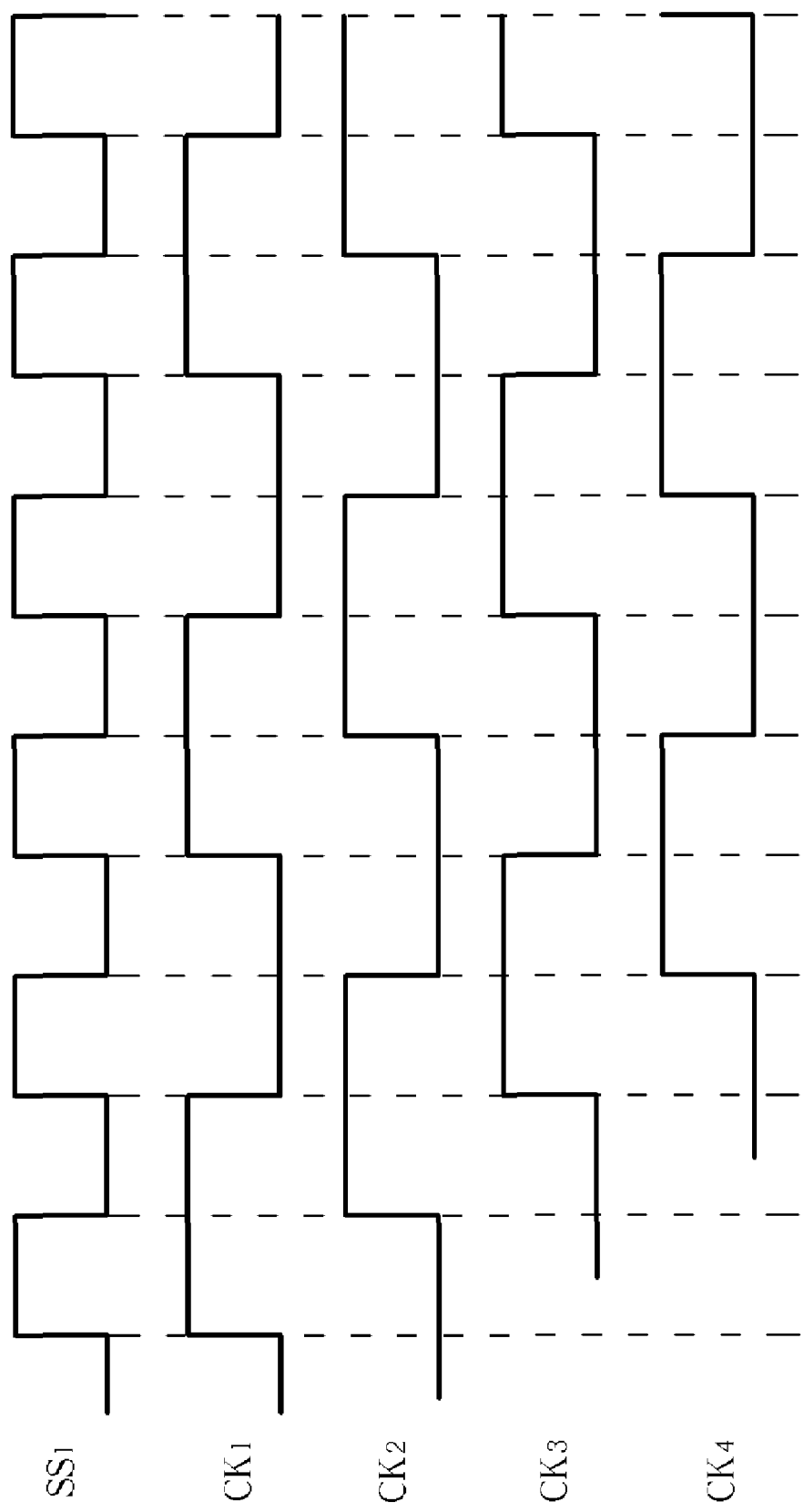
FIG. 3 is a timing diagram of the multiphase clock signal generating circuit shown in FIG. 2.
Figure 4:
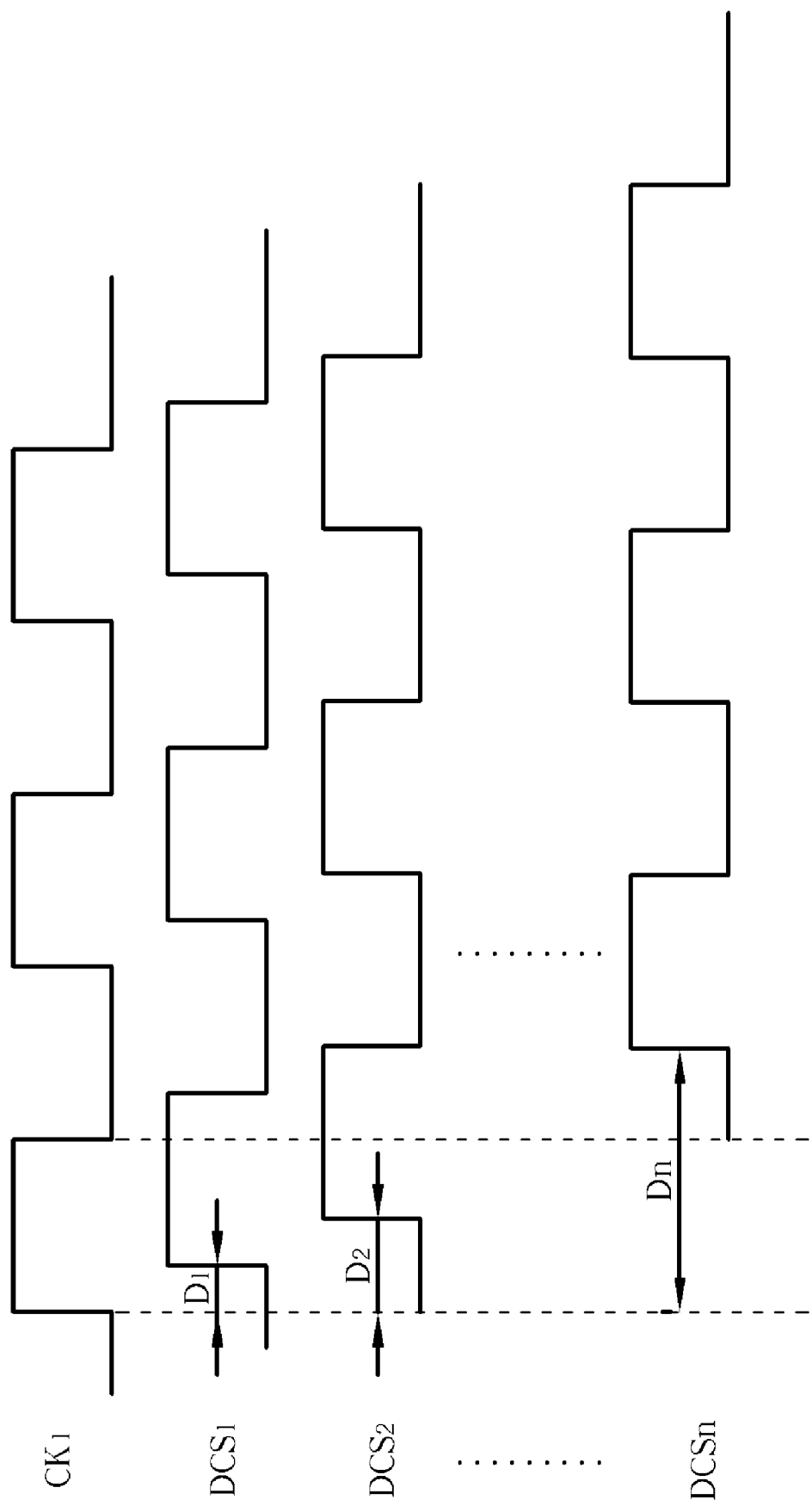
FIG. 4 is a timing diagram of the delay line shown in FIG. 2.

Please refer to FIG. 2. FIG. 2 is a block diagram illustrating a delay circuit utilizing an adjusting circuit according to a preferred embodiment of the present invention. As shown in FIG. 2, the delay circuit 200 comprises an adjusting circuit 201, a multiphase clock generating circuit 203, a delay line 205, and a selector 207. The timing diagram of a multiphase clock generating circuit 203 is shown in FIG. 3. Referring to FIG. 3, the multiphase clock generating circuit 203 generates a plurality of clock signals having different phases according to a specific clock signal $SS_1$, this is known as rough tuning. In this embodiment, four clock signals $CK_1$, $CK_2$, $CK_3$ and $CK_4$ having a phase difference of 90 degrees are shown as an example. One of the clock signals ($CK_1$, $CK_2$, $CK_3$ and $CK_4$) is selected as a second specific clock signal $SS_2$ to be inputted into the delay line 205, and delay clock signals DCS are generated via the delay units 209, 211, 213 (only some are illustrated in the diagram). FIG. 4 is a timing diagram of the delay line 205 shown in FIG. 2. As shown in FIG. 4, the delay clock signals $DCS_1$, $DCS_2$ ... $DCS_n$ have different delay amounts $D_1$, $D_2$ ... $D_n$, respectively. Since the clock signal is synchronized after one of the delay clock signals $DCS_1$, $DCS_2$ ... $DCS_n$ is selected as the target delay signal, the system should be stable theoretically. However, each delay unit of the delay line 205 varies by many factors, resulting in errors of the synchronized clock signal. In this case, the adjusting circuit 201 will determine a target delay unit TDU according to a third specific clock signal $SS_3$ and delay signals $DCS_1$, $DCS_2$ ... $DCS_n$. In other words, the adjusting circuit 201 determines which one of the delay clock signals $DCS_1$, $DCS_2$ ... $DCS_n$ is the target delay clock signal to meet the demands of the current system, this is known as fine tuning. Referring to FIG. 2, the selector 207 selects a target delay clock signal TDCS from the delay signals $DCS_1$, $DCS_2$ ... $DCS_n$ according to the target delay unit TDU.

Figure 5:
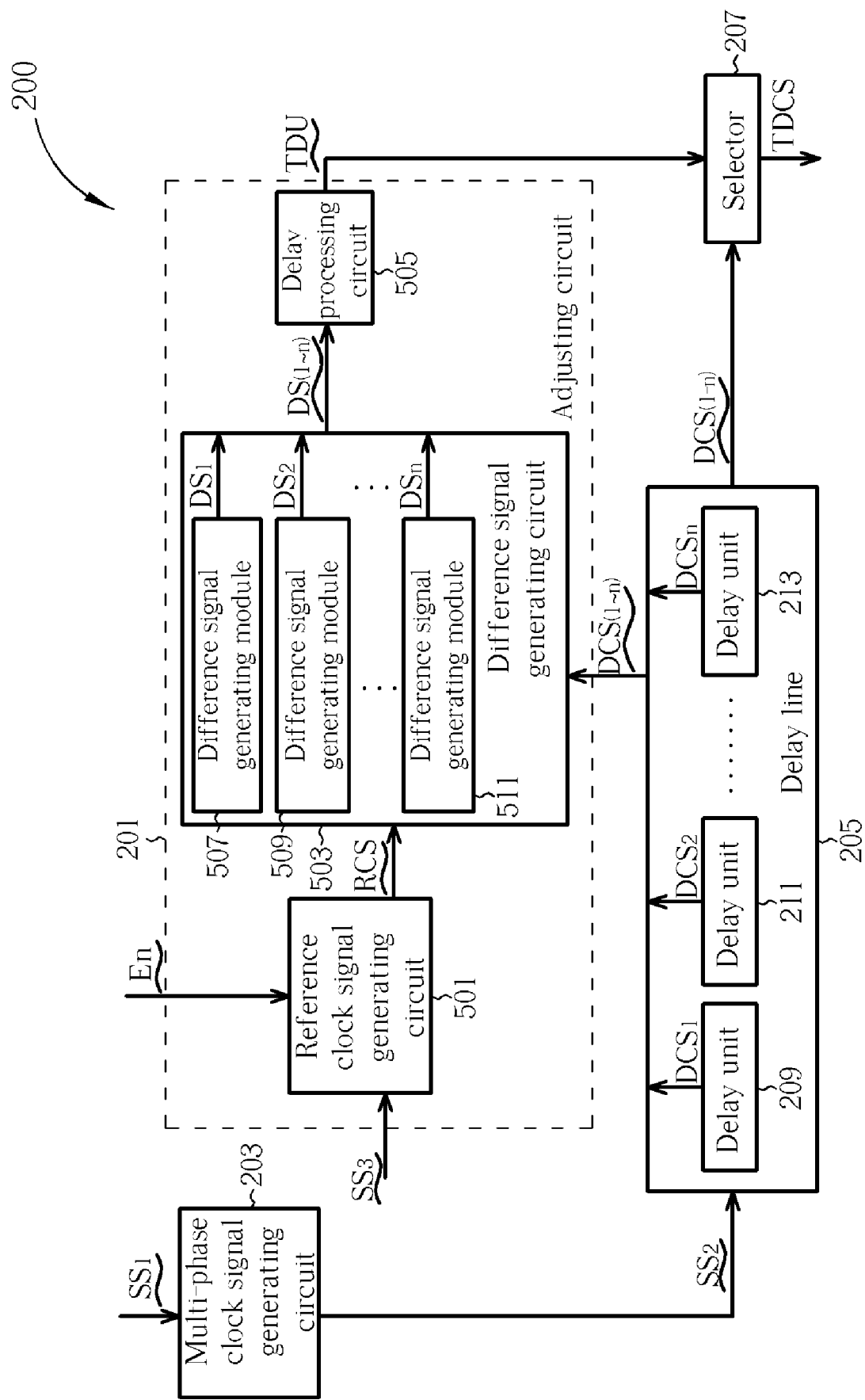
FIG. 5 is a schematic diagram illustrating the adjusting circuit shown in FIG. 2 according to the preferred embodiment of the present invention.

FIG. 5 is a schematic diagram of a preferred embodiment of the adjusting circuit shown in FIG. 2. As shown in FIG. 5, the adjusting circuit 201 includes a reference clock signal generating circuit 501, a difference signal generating circuit 503, and a delay processing circuit 505. The difference signal generating circuit 503 includes several difference signal generating modules 507, 509, 511 (only a few are illustrated).

The reference clock generating circuit 501 is used for generating a reference clock signal RCS according to a third specific clock signal $SS_3$. The difference signal generating circuit 503 is used for generating difference signals $DS_1$~$DS_n$ according to a reference clock signal RCS and the delay clock signals $DCS_1$~$DCS_n$ from the delay line 205. The delay processing circuit 505 computes a corresponding number of delay units for a specific phase of the reference clock signal according to the difference signals $DS_1$~$DS_n$. The delay processing circuit 505 may then determine a target delay unit TDU corresponding to the target delay clock signal according to the computing result of the delay processing circuit 505 and outputs the target delay unit TDU signal to the selector 207. Since a multiphase clock generating circuit 203 should be well known, the description thereof is omitted here for brevity.

Figure 6:
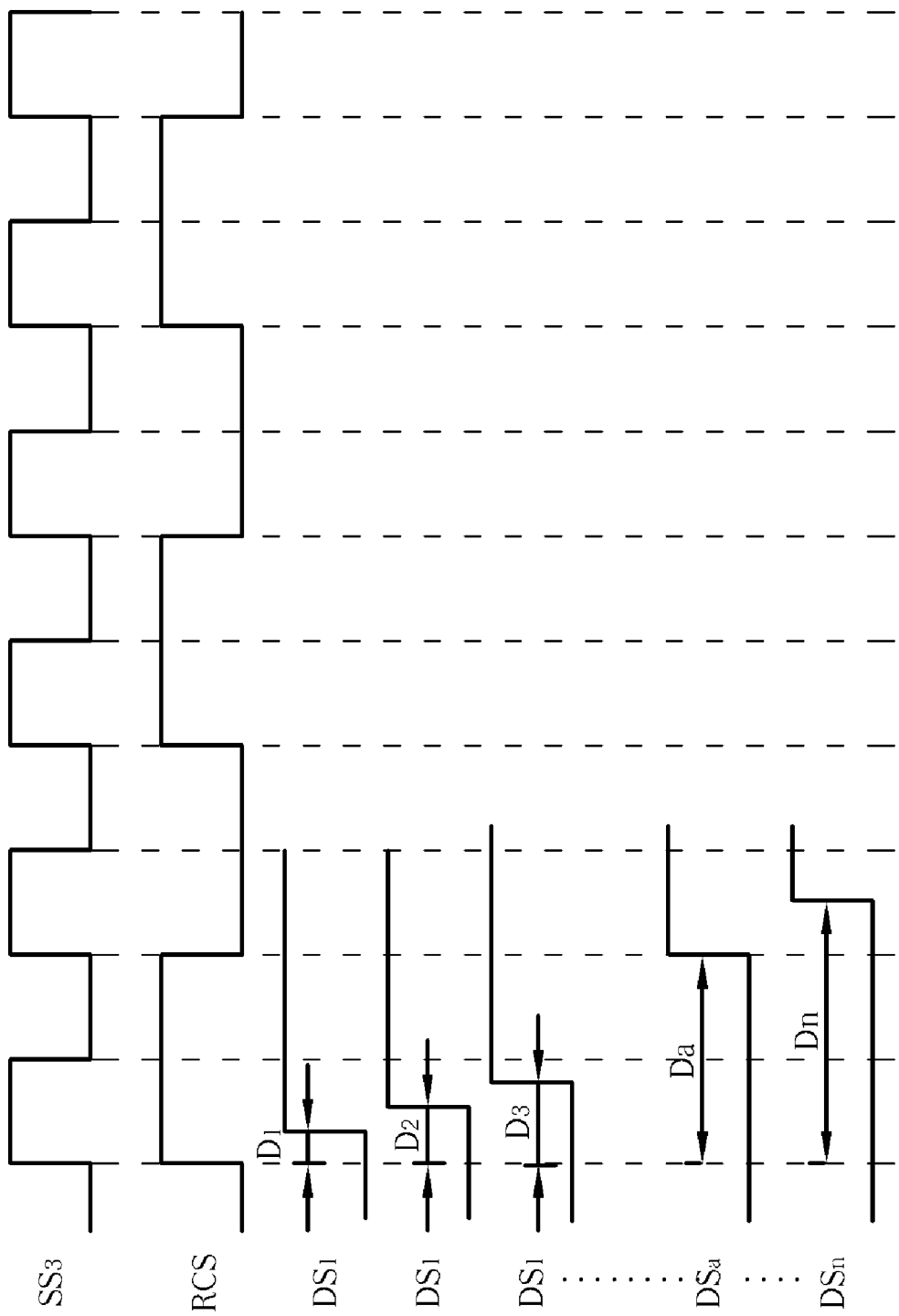
FIG. 6 is the timing diagram of the difference signal generating circuit shown in FIG. 5.

FIG. 6 is the timing diagram of the difference signal generating circuit shown in FIG. 5. In this embodiment, the frequency of the reference clock signal RCS is 1/2 that of the third specific clock signal $SS_3$. The difference signals $DS_1$~$DS_n$ are signals that maintain at logic level 1 after rising. The differences $D_1$~$D_n$ correspond to differences between the reference clock signal RCS and difference signals $DS_1$~$DS_n$. The delay processing circuit 505 computes the corresponding number of delay units for the specific phase of the reference clock signal RCS according to the difference values $D_1$~$D_n$. If the difference value of a difference signal is larger than the specific phase, the number of delay units corresponding to the difference signal is considered to be inappropriate. Taking this embodiment as an example, the amount of difference signals less than the 90-degree phase reference clock signal RCS (i.e., the 180-degree phase third specific clock signal $SS_3$) is A, indicating that the third specific clock signal $SS_3$ corresponds to A delay units. By receiving this amount, the delay processing circuit 505 determines a new target delay unit TDU according to a new to old delay amount ratio. That is, if originally the 180-degree phase third specific clock signal $SS_3$ corresponds to X delay units and the 120-degree phase delay corresponds to Y delay units, and the new amount of delay units corresponding to the 180-degree phase third specific clock signal $SS_3$ is known to be A, then the new amount of delay units corresponding to the 120-degree phase delay which is assumed to be B here should be equal to $$\frac{Y}{X} \times A, \text{ since } \frac{B}{A} \text{ is equal to } \frac{Y}{X}.$$

Thus, the value of B is easily derived from $$\frac{Y}{X} \times A.$$

Additionally, an enable signal En that inputs into the reference clock signal generating circuit 501 can control the generation of the reference clock, whether to generate the reference clock or not. The delay of the delay units of the delay line 205 is determined to be in an acceptable range if the reference clock signal RCS is not generated, hence, a reselection of a new corresponding amount of delay units is not necessary. In this embodiment, the enable signal En can be generated from a microprocessor (not illustrated).

It should be noted that different phase clock signals are not restricted to be generated by the multiphase clock signal generating circuit and can be implemented by directly inputting a specific clock signal to the delay line. Furthermore, the reference clock signal RCS is not restricted to be generated by the reference clock signal generating circuit 501 and can be implemented by directly inputting a specific clock signal as the reference clock signal RCS. Moreover, the target delay unit TDU signal of the adjusting circuit of the present invention is not restricted for being transmitted to the selector for selecting the target delay unit TDU only, the target delay unit TDU signal can also be applied to other purposes. Relevant modifications related to the aforementioned should also fall within the scope of the present invention.

The circuit presented in this invention is equipped with the following advantages: a greatly reduced die area, the accuracy of a digital delay line, and a self adjusting mechanism utilization to obtain a fixed delay phase signal. If a multiphase clock generating circuit is also included, phase delay signals that are not affected by PVT can be generated, hence reducing the length of the delay line.

In addition, if the circuit is utilized for the reading of memories such as a double-data-rate synchronous dynamic random access memory (DDR SDRAM), then the frequency of the first specific clock signal $SS_1$ and the third specific clock signal $SS_3$ will be twice of that of the clock from the system in which the memory is located. Therefore, the system frequency replaces the external clock signal as the input frequency source, such as the data strobe (DQS) signal of a DDR memory. The data reading error due to external clock signals that are affected by the outside environment is therefore avoided. Furthermore, since the data is read by the delay clock signal with a known phase error, synchronization is no longer necessary. The detailed circuit structure of the reference clock signal generating circuit 501, the difference signal generating circuit 503 and the delay processing circuit 505 are described with the figures as below.

Figure 7:
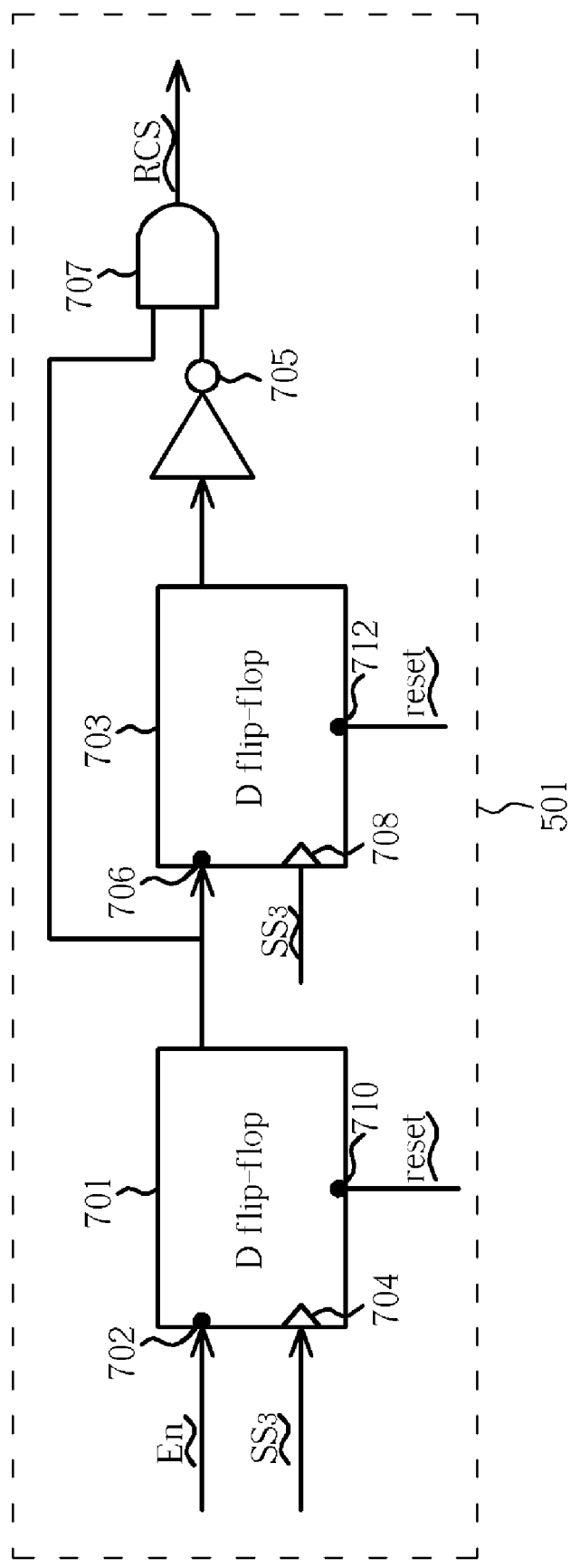
FIG. 7 is a schematic diagram illustrating the reference clock signal generating circuit shown in FIG. 5 according to the preferred embodiment of the present invention.
Figure 8:
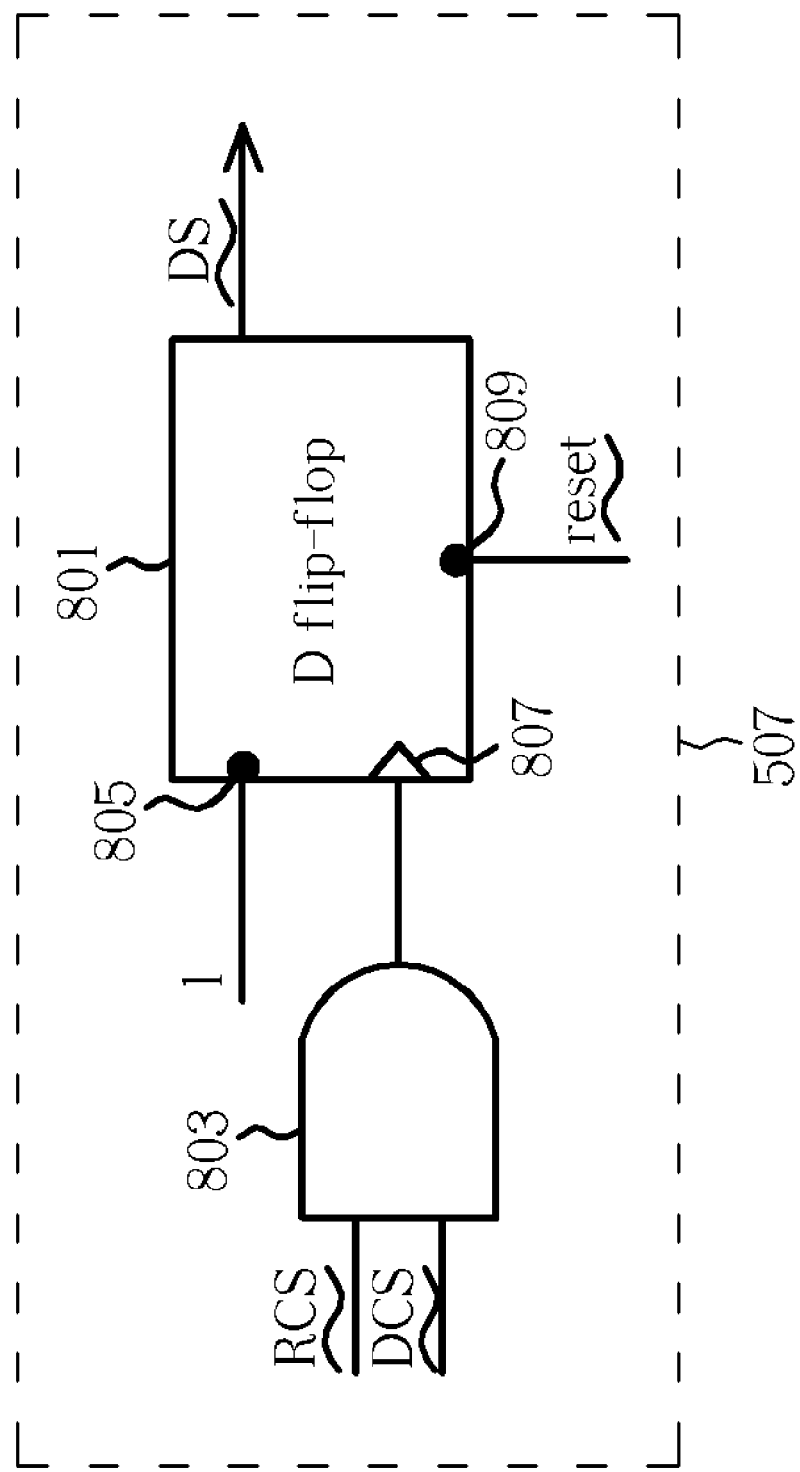
FIG. 8 is a schematic diagram illustrating the difference signal generating circuit shown in FIG. 5 according to the preferred embodiment of the present invention.

FIG. 7 is a schematic diagram of a preferred embodiment of the present invention, illustrating the reference clock signal generating circuit 501 shown in FIG. 5. It should be noted that the circuit structure is only given as an example and is not meant to limit the scope of the present invention. Persons skilled in the art can easily utilize other circuits to achieve the same function. As shown in FIG. 7, the reference clock signal generating circuit 501 comprises D flip-flops 701 and 703, an inverter 705 and an AND gate 707. The enable signal En is inputted into the data terminal of the D flip-flop 701, and the third specific clock signal $SS_3$ is inputted into the clock terminal of the D flip-flops 701 and 703. Also, the reset signal reset is inputted into the reset terminals of the D flip-flops 701 and 703, and the two input terminals of the AND gate 707 respectively receive the output of the D flip-flop 701 and the inverted output of the D flip-flop 703. According to this circuit structure, a reference clock signal RCS having 1/2 the frequency of the third specific clock signal $SS_3$ can be obtained, as shown in FIG. 6. If the adjusting circuit is used for the reading of the memory data for instance, the frequency of the reference clock signal RCS should be equal to that of the system clock signal, since the frequency of the third specific clock signal $SS_3$ is twice of that of the system clock signal FIG. 8 is a schematic diagram of a preferred embodiment of the present invention, illustrating the difference signal generating module shown in FIG. 5. As shown in FIG. 8, the difference signal generating module 507 comprises a D flip-flop 801 and an AND gate 803. The AND gate 803 receives the reference clock signal RCS and one of the delay clock signals $DCS_1$~$DCS_n$ and has an output terminal coupled to the clock terminal of the D flip-flop 801. The data terminal of the D flip-flop 801 receives a logic level 1, and the reset terminal 809 receives a reset signal reset. According to the circuit, difference signals $DS_1$~$DS_n$ that respectively correspond to delay clock signals $DCS_1$~$DCS_n$ can be generated, as shown in FIG. 6. Similarly, the circuit is not meant to limit the scope of the present invention, persons skilled in the art can easily utilize other circuits to achieve the same function.

Figure 9:
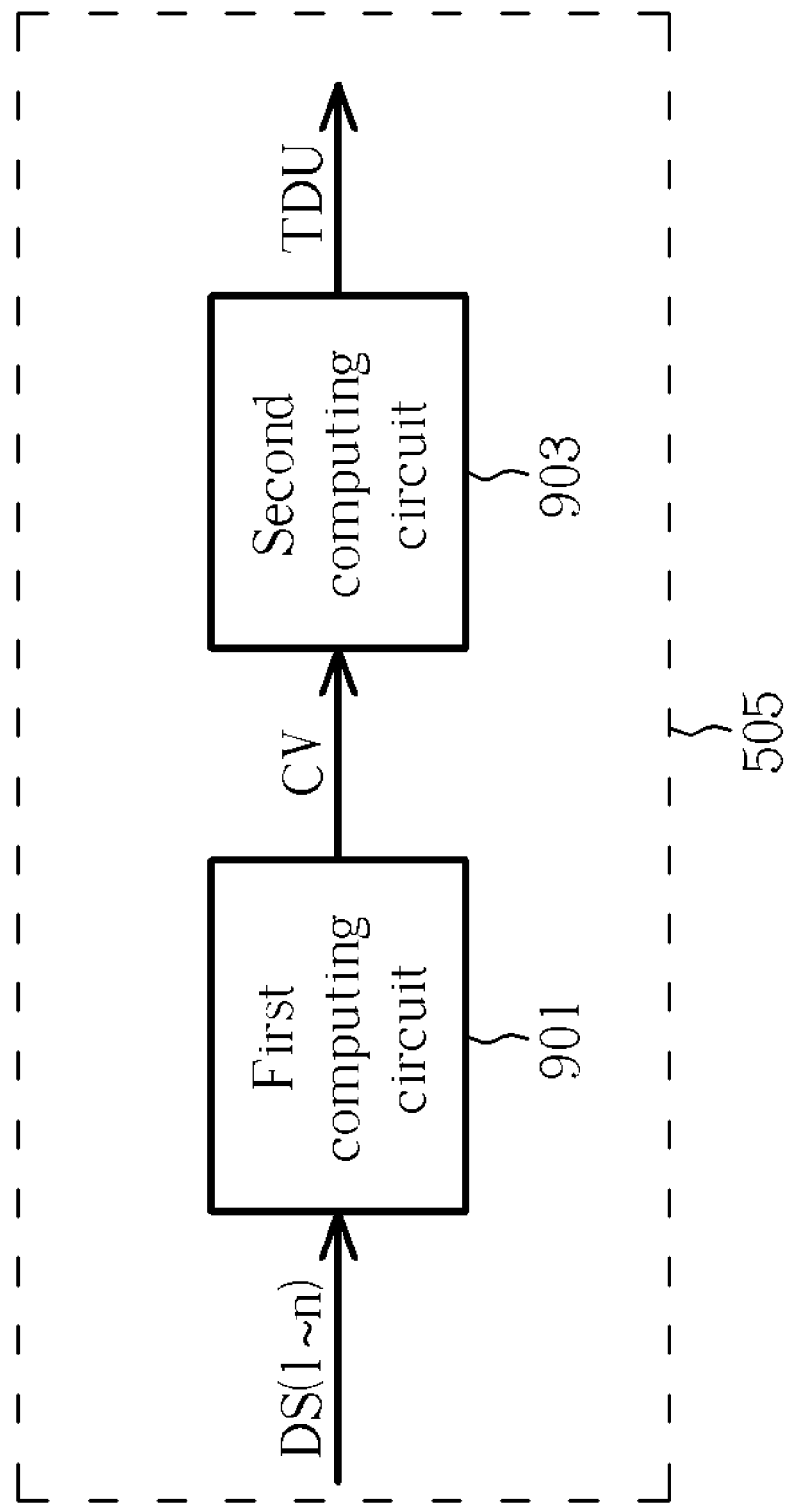
FIG. 9 is a schematic diagram illustrating the delay processing circuit shown in FIG. 5 according to the preferred embodiment of the present invention.

FIG. 9 is a schematic diagram of the preferred embodiment of the present invention, illustrating the delay processing circuit shown in FIG. 5. As shown in FIG. 9, the delay processing circuit 505 comprises a first computing circuit 901 and a second computing circuit 903. The first computing circuit 901 computes the amount of the difference signals that correspond to a specific logic level at a specific phase of the reference clock signal and determines a counting value CV according to the amount. The second computing circuit 903 determines the target delay clock signal according to the counting value CV, by determining the corresponding delay unit. As shown in FIG. 6, the specific phase of this embodiment is 90 degrees (i.e., the 180-degree phase third specific clock signal $SS_3$), the amount of the difference signals corresponding to logic level 1 within the 90-degree phase is A, and the second computing circuit 903 determines the new target delay unit TDU according to the $$\frac{Y}{X} \times A$$

relationship.

In addition, the first computing circuit 901 can divide A by N to obtain the counting value CV, wherein N is a positive integer. Taking N=2 as an example, the first computing circuit 901 obtains the amount of difference signals corresponding to logic level 1 within the 90-degree phase of the reference clock signal RCS. Besides, the first and second computing circuits in this embodiment can be implemented by a microprocessor.

Figure 10:
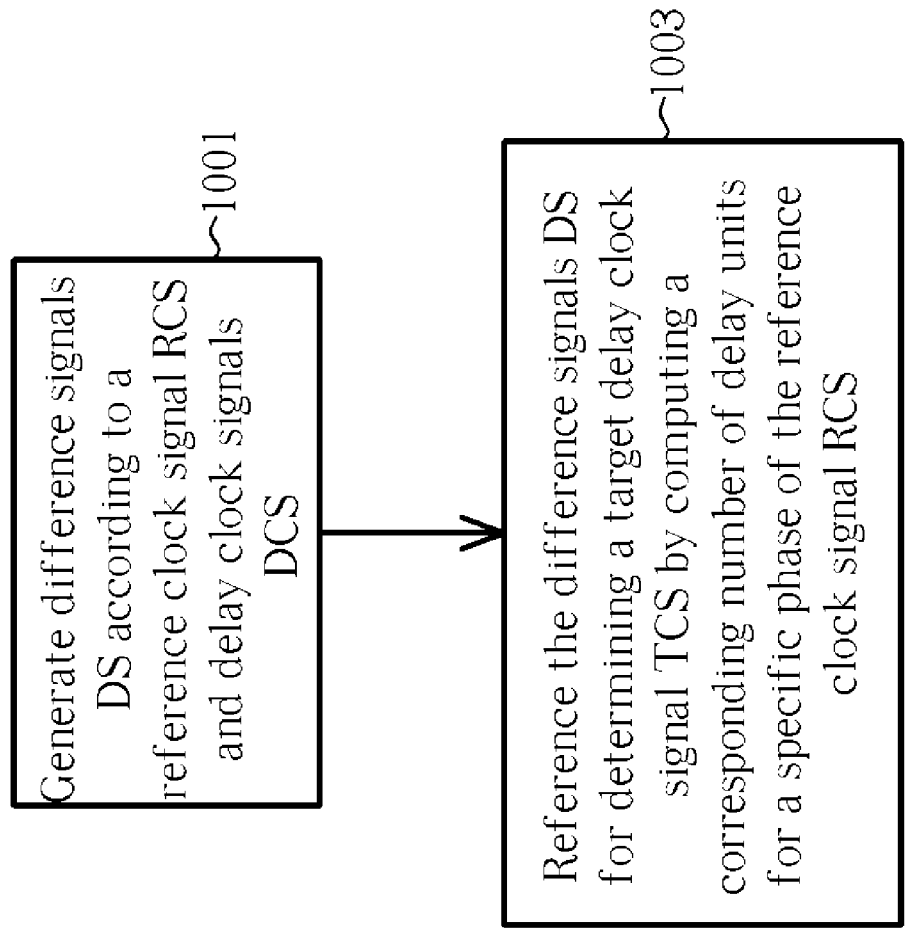
FIG. 10 is a flow chart of a method for adjusting a delay clock signal corresponding to an adjusting circuit of the present invention shown in FIG. 5.

FIG. 10 is a flow chart of a method for adjusting a delay clock signal corresponding to a preferred embodiment of an adjusting circuit of the present invention. The method comprises the following steps:

Step 1001: Generate difference signals DS according to a reference clock signal RCS and delay clock signals DCS.

Step 1003: Reference the difference signals DS for determining a target delay clock signal TCS by computing a corresponding number of delay units for a specific phase of the reference clock signal RCS, wherein the target delay clock signal is one of the delay clock signals.

FIG. 11 is a flow chart of a method for adjusting a delay clock signal corresponding to another preferred embodiment of the adjusting circuit of the present invention. The method comprises the following steps:

Step 1101: Utilize a delay line with delay units to generate delay clock signals DCS with different amounts of delay.

Step 1103: Generate difference signals DS according to a reference clock signal RCS and delay clock signal DCS.

Step 1105: Reference the difference signals DS for determining a target delay clock signal TCS by computing a corresponding number of delay units for a specific phase of the reference clock signal RCS, wherein the target delay clock signal is one of the delay clock signals.

Detailed description and extension of the two methods are mentioned further above, and thus omitted herein for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An adjusting circuit for determining a target delay clock signal of a delay circuit having a plurality of delay units, the delay circuit generates a plurality of delay clock signals, the adjusting circuit comprising:

a difference signal generating circuit, for generating a plurality of difference signals according to a reference clock signal and the delay clock signals, wherein the difference signal generating circuit comprises a plurality of difference signal generating modules, each of the difference signal generating modules receiving the reference clock signal and a corresponding delay clock signal to generate a difference signal and including an AND gate and a D flip-flop, where the AND gate receives the reference clock signal and the corresponding delay clock signal, an output terminal of the AND gate is coupled to the clock terminal of the D flip-flop, and the data terminal of the D flip-flop receives a constant logic level;

a delay processing circuit, coupled to the difference signal generating circuit, for determining the target delay clock signal by computing a corresponding number of delay units for a specific phase of the reference clock signal according to the difference signals; and a multiphase clock signal generating circuit, for generating a plurality of clock signals corresponding to different phases according to a first specific clock signal, and outputting one of the clock signals to the delay circuit to generate the delay clock signals;

wherein the target delay clock signal is one of the delay clock signals.

2. An adjusting circuit for determining a target delay clock signal of a delay circuit having a plurality of delay units, the delay circuit generates a pluarality of delay clock signals, the adjusting circuit comprising:

a difference signal generating circuit, for generating a plurality of difference signals according to a reference clock signal and the delay clock signals;

a delay processing circuit, coupled to the difference signal generating circuit, for determining the target delay clock signal by computing a corresponding number of delay units for a specific phase of the reference clock signal according to the difference signals; and a multiphase clock signal generating circuit, for generating a plurality of clock signals corresponding to different phases according to a first specific clock signal, and outputting one of the clock signals to the delay circuit to generate the delay clock signals;

wherein the target delay clock signal is one of the delay clock signals, and the delay processing circuit comprises:

a first computing circuit, for computing an amount of the difference signals that corresponds to a specific logic level at a specific phase of the reference clock signal, and for determining a counting value according to the amount; and a second computing circuit, coupled to the first computing circuit, for determining the target delay clock signal according to the counting value.

3. The adjusting circuit of claim 2, wherein the first computing circuit divides the amount by N to obtain the counting value, wherein N is a positive integer.

4. The adjusting circuit of claim 2, wherein the first and second computing circuits are implemented by a microprocessor.

5. An adjusting circuit for determining a target delay clock signal of a delay circuit having a plurality of delay units, the delay circuit generates a pluarality of delay clock signals, the adjusting circuit comprising:

a difference signal generating circuit, for generating a plurality of difference signals according to a reference clock signal and the delay clock signals;

a delay processing circuit, coupled to the difference signal generating circuit, for determining the target delay clock signal by computing a corresponding number of delay units for a specific phase of the reference clock signal according to the difference signals; and a multiphase clock signal generating circuit, for generating a plurality of clock signals corresponding to different phases according to a first specific clock signal, and outputting one of the clock signals to the delay circuit to generate the delay clock signals;

wherein the target delay clock signal is one of the delay clock signals, and the corresponds number of delay units for a specific phase of the reference clock signal is computed by a new to old delay amount ratio according to the difference signals.

6. An adjusting circuit for determining a target delay clock signal of a delay circuit having a plurality of delay units, the delay circuit generates a pluarality of delay clock signals, the adjusting circuit comprising:

a difference signal generating circuit, for generating a plurality of difference signals according to a reference clock signal and the delay clock signals;

a delay processing circuit, coupled to the difference signal generating circuit, for determining the target delay clock signal by computing a corresponding number of delay units for a specific phase of the reference clock signal according to the difference signals;

a multiphase clock signal generating circuit, for generating a plurality of clock signals corresponding to different phases according to a first specific clock signal, and outputting one of the clock signals to the delay circuit to generate the delay clock signals; and a reference clock signal generating circuit, for generating the reference clock signal according to a second specific clock signal;

wherein the target delay clock signal is one of the delay clock signals, and the reference clock signal generating circuit further receives an enable signal to determine whether the reference clock signal should be generated or not.

7. An adjusting circuit for determining a target delay clock signal of a delay circuit having a plurality of delay units, the delay circuit generates a pluarality of delay clock signals, the adjusting circuit comprising:

a difference signal generating circuit, for generating a plurality of difference signals according to a reference clock signal and the delay clock signals;

a delay processing circuit, coupled to the difference signal generating circuit, for determining the target delay clock signal by computing a corresponding number of delay units for a specific phase of the reference clock signal according to the difference signals;

a multiphase clock signal generating circuit, for generating a plurality of clock signals corresponding to different phases according to a first specific clock signal, and outputting one of the clock signals to the delay circuit to generate the delay clock signals; and a reference clock signal generating circuit, for generating the reference clock signal according to a second specific clock signal;

wherein the target delay clock signal is one of the delay clock signals, and the second specific clock signal is generated such that the frequency of the reference clock signal and the frequency of a system clock signal are substantially the same, the system clock signal being generated for general reference within the system that comprises the adjusting circuit.

8. A method for adjusting a delay clock signal, for a delay circuit having a plurality of delay units, the delay circuit generates a plurality of delay clock signals, the method comprising:

(a) generating a plurality of difference signals according to a reference clock signal and the delay clock signals;

(b) determining a target delay clock signal by computing a corresponding number of delay units for a specific phase of the reference clock signal according to the difference signals, wherein the target delay clock signal is one of the delay clock signals; and generating a plurality of clock signals corresponding to different phases according to a first specific clock signal, and outputting one of the clock signals to the delay circuit to generate the delay clock signals;

wherein the step (b) comprises:

(c) computing an amount of the difference signals corresponding to a specific logic level at a specific phase of the reference clock signal;

(d) determining a counting value according to the amount; and (e) determining the target delay clock signal according to the counting value.

9. The method of claim 8, wherein the step (c) divides the amount by N to obtain the counting value, wherein N is a positive integer.

10. The method of claim 8, wherein the steps (c), (d) and (e) are implemented by a microprocessor.

11. A method for adjusting a delay clock signal, for a delay circuit having a plurality of delay units, the delay circuit generates a plurality of delay clock singals, the method comprising:
   (a) generating a plurality of difference signals according to a reference clock signal and the delay clock signals;
   (b) determining a target delay clock signal by computing a corresponding number of delay units for a specific phase of the reference clock signal according to the difference signals, wherein the target delay clock signal is one of the delay clock signals; and
   generating a plurality of clock signals corresponding to different phases according to a first specific clock signal, and outputting one of the clock signals to the delay circuit to generate the delay clock signals;
   wherein the corresponding number of delay units for a specific phase of the reference clock signal is computed by a new to old delay amount ratio according to the difference signals.

12. A method for adjusting a delay clock signal, for a delay circuit having a plurality of delay units, the delay circuit generates a plurality of delay clock singals, the method comprising:
   (a) generating a plurality of difference signals according to a reference clock signal and the delay clock signals;
   (b) determining a target delay clock signal by computing a corresponding number of delay units for a specific phase of the reference clock signal according to the difference signals, wherein the target delay clock signal is one of the delay clock signals;
   (f) generating the reference clock signal according to a second specific clock signal; and
   generating a plurality of clock signals corresponding to different phases according to a first specific clock signal, and outputting one of the clock signals to the delay circuit to generate the delay clock signals;
   wherein the step (f) further receives an enable signal to dtermine whether the reference clock signal should be generated or not.

13. A method for adjusting a delay clock signal, for a delay circuit having a plurality of delay units, the delay circuit generates a plurality of delay clock singals, the method comprising:
   (a) generating a plurality of difference signals according to a reference clock signal and the delay clock signals;
   (b) determining a target delay clock signal by computing a corresponding number of delay units for a specific phase of the reference clock signal according to the difference signals, wherein the target delay clock signal is one of the delay clock signals;
   (f) generating the reference clock signal according to a second specific clock signal; and
   generating a plurality of clock signals corresponding to different phases according to a first specific clock signal, and outputting one of the clock signals to the delay circuit to generate the delay clock signals;
   wherein the second specific clock signal is generated such that the frequency of the reference clock signal and the frequency of a system clock signal are substantially the same, wherein the system clock signal is being generated for general reference within the system that comprises the adjusting circuit.

14. An adjusting circuit for determining a target delay clock signal of a delay circuit having a plurality of delay units, the delay circuit generates a pluarality of delay clock signals, the adjusting circuit comprising:
   a difference signal generating circuit, for generating a plurality of difference signals according to a reference clock signal and the delay clock signals; and
   a delay processing circuit, coupled to the difference signal generating circuit, for determining the target delay clock signal by computing a corresponding number of delay units for a specific phase of the reference clock signal according to the difference signals;
   wherein the target delay clock signal is one of the delay clock signals;
   wherein the difference signal generating circuit comprises a plurality of difference signal generating modelues, each of the difference signal generating modules receives the reference clock signal and a corresponding delay clock signal to generate a difference signal;
   wherein each difference signal generating module includes an AND gate and a D flip-flop, where the AND gate receives the reference clock signal and the corresponding delay clock signal, an output terminal of the AND gate is coupled to the clock terminal of the D flip-flop, and the data terminal of the D flip-flop receives a constant logic level.

15. The adjusting circuit of claim 14, wherein the delay processing circuit comprises:
   a first computing circuit, for computing an amount of the difference signals that correspond to a specific logic level at a specific phase of the reference clock signal, and for determining a counting value according to the amount;
   a second computing circuit, coupled to the first computing circuit, for determining the target delay clock signal according to the counting value.

16. The adjusting circuit of claim 15, wherein the first computing circuit divides the amount by N to obtain the counting value, wherein N is a positive integer.

17. The adjusting circuit of claim 15, wherein the first and second computing circuits are implemented by a microprocessor.

18. The adjusting circuit of claim 14, wherein the corresponding number of delay units for a specific phase of the reference clock signal is computed by a new to old delay amount ratio according to the difference signals.

19. The adjusting circuit of claim 14, further comprising a reference clock signal generating circuit, for generating the reference clock signal according to a second specific clock signal.

20. The adjusting circuit of claim 19, wherein the reference clock signal generating circuit further receives an enable signal to determine whether the reference clock signal should be generated or not.

21. The adjusting circuit of claim 19, wherein the second specific clock signal is generated such that the frequency of the reference clock signal and the frequency of a system clock signal are substantially the same, wherein the system clock signal is being generated for reference within the system that comprises the adjusting circuit.

22. An adjusting circuit for determining a target delay clock signal of a delay circuit having a plurality of delay units, the delay circuit generates a plurality of delay clock signals, the ajusting circuit comprising:
   a difference signal generating circuit, for generating a plurality of difference signals according to a reference clock signal and the delay clock signals; and
   a delay processing circuit, coupled to the difference signal generating circuit, for determining the target delay clock signal by computing a corresponding number of delay units for a specific phase of the reference clock signal according to the difference signals, the delay processing circuit comprising:
- a first computing circuit, for computing an amount of the difference signals that correspond to a specific logic level at a specific phase of the reference clock signal, and for determining a counting value according to the amount; and
- a second computing circuit, coupled to the first computing circuit, for determining the target delay clock signal according to the counting value;

wherein the target delay clock signal is one of the delay clock signals.

23. The adjusting circuit of claim 22, wherein the first computing circuit divides the amount by N to obtain the counting value, wherein N is a positive integer.

24. The adjusting circuit of claim 22, wherein the corresponding number of delay units for a specific phase of the reference clock signal is computed by a new to old delay amount ratio according to the difference signals.

25. The adjusting circuit of claim 22, wherein the first and second computing circuits are implemented by a microprocessor.

26. The adjusting circuit of claim 22, further comprising a reference clock signal generating circuit, for generating the reference clock signal according to a second specific clock signal.

27. The adjusting circuit of claim 26, wherein the reference clock signal generating circuit further receives an enable signal to determine whether the reference clock signal should be generated or not.

28. The adjusting circuit of claim 26, wherein the second specific clock signal is generated such that the frequency of the reference clock signal and the frequency of a system clock signal are substantially the same, wherein the system clock signal is being generated for general reference within the system that comprises the adjusting circuit.

29. An adjusting circuit for determining a target delay clock signal of a delay circuit having a plurality of delay units, the delay circuit generates a plurality of delay clock signals, the adjusting circuit comprising:
- a difference signal generating circuit, for generating a plurality of difference signals according to a reference clock signal and the delay clock signals; and
- a delay processing circuit, coupled to the difference signal generating circuit, for determining the target delay clock signal by computing a corresponding number of delay units for specific phase of the reference clock signal according to the difference signals;

wherein the target delay clock signal is one of the delay clock signals;

wherein the corresponding number of delay units for a specific phase of the reference clock signal is computed by a new to old delay amount ratio according to the difference signals.

30. The adjusting circuit of claim 29, further comprising a reference clock signal generating circuit, for generating the reference clock signal according to a second specific clock signal.

31. The adjusting circuit of claim 30, wherein the reference clock signal generating circuit further receives an enable signal to determine whether the reference clock signal be granted or not.

32. The adjusting circuit of claim 30, wherein the second specific clock signal is generated such that the frequency of the reference clock signal and the frequency of a system clock are substantially the same, wherein the system clock signal is being generating for general reference within the system that comprises the adjusting circuit.

33. An adjusting circuit for determining a target delay clock signal of a delay circuit having a plurality of delay units, the delay circuit generates a plurality of delay clock signals, the adjusting circuit comprising:
- a difference signal generating circuit, for generating a plurality of difference signals according to a reference clock signal and the delay clock signals;
- a delay processing circuit, coupled to the difference signal generating circuit, for determining the target delay clock signal by computing a corresponding number of delay units for a specific phase of the reference clock signal according to the difference signals; and
- a reference clock signal generating circuit, for generating the reference clock signal according to a second specific clock signal;

wherein the target delay clock signal is one of the delay clock signals, and the reference clock signal generating circuit further receives an enable signal to determine whether the reference clock signal should be generated or not.

34. An adjusting circuit for determining a target delay clock signal of a delay circuit having a plurality of delay units, the delay circuit generates a plurality of delay clock signals, the adjusting circuit comprising:
- a difference signal generating circuit, for generating a plurality of difference signals according to a reference clock signal and the delay clock signals;
- a delay processing circuit, coupled to the difference signal generating circuit, for determining the target delay clock signal by computing a corresponding number of delay units for a specific phase of the reference clock signal according to the difference signals; and
- a reference clock signal generating circuit, for generating the reference clock signal according to a second specific clock signal;

wherein the target delay clock signal is one of the delay clock signals, the second specific clock signal is generated such that the frequency of the reference clock signal and the frequency of a system clock signal are substantially the same, and the system clock signal is being generated for general reference within the system that comprises the adjusting circuit.

* * * * *